United States Patent
Watanabe et al.

(10) Patent No.: US 6,285,163 B1
(45) Date of Patent: Sep. 4, 2001

(54) MEANS FOR ESTIMATING CHARGED STATE OF BATTERY AND METHOD FOR ESTIMATING DEGRADED STATE OF BATTERY

(75) Inventors: Nobuo Watanabe, Toyota; Yukio Kuroda, Susono; Yoshiaki Kikuchi, Toyota, all of (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 09/701,067

(22) PCT Filed: May 25, 1999

(86) PCT No.: PCT/JP99/02728

§ 371 Date: Nov. 24, 2000

§ 102(e) Date: Nov. 24, 2000

(87) PCT Pub. No.: WO99/61929

PCT Pub. Date: Dec. 2, 1999

(30) Foreign Application Priority Data

May 28, 1998 (JP) .................................................. 10-146828
Jun. 9, 1998 (JP) .................................................. 10-160393

(51) Int. Cl.⁷ .......................... H01M 10/44; H01M 10/46
(52) U.S. Cl. .......................... 320/132; 320/149; 324/426
(58) Field of Search .................................. 320/132, 149, 320/DIG. 21; 324/426, 427, 433; 340/635, 636

(56) References Cited

U.S. PATENT DOCUMENTS 5,808,445 * 9/1998 Aylor et al. ............................ 320/132
6,091,245 * 7/2000 Bertness ................................ 324/426

FOREIGN PATENT DOCUMENTS

| | | |
|---|---|---|
| 4-505660 | 10/1992 | (JP) . |
| 5-142313 | 6/1993 | (JP) . |
| 5-142314 | 6/1993 | (JP) . |
| 6-20723 | 1/1994 | (JP) . |
| 6-150981 | 5/1994 | (JP) . |
| 8-336202 | 12/1996 | (JP) . |
| 9-33622 | 2/1997 | (JP) . |
| 9-96665 | 4/1997 | (JP) . |
| 9-243716 | 9/1997 | (JP) . |
| 10-20003 | 1/1998 | (JP) . |
| 10-104324 | 4/1998 | (JP) . |
| 10-92475 | 4/1998 | (JP) . |

* cited by examiner

*Primary Examiner*—Edward H. Tso
(74) *Attorney, Agent, or Firm*—Oliff & Berridge PLC

(57) ABSTRACT

Means for estimating the charged state of a battery, capable of accurately estimating an SOC even though the battery repeats charging/discharging in short cycles. The charging/discharging current Ib measured by current sensing means (10) is integrated, and pseudo-SOC estimating means estimates a pseudo-SOC. Electromotive force estimating means (16) estimates the open voltage Voc from the pseudo-SOC. Voltage change estimating means (18) estimates the voltage change Vr due to the internal resistance from the charging/discharging current Ib. Dynamic voltage change estimating means (20) estimates the voltage change Vdyn due to the change of the charging/discharging current. An adder (22) adds the Voc, Vr, and Vdyn to calculate an estimated voltage Vest of the battery. SOC correction calculating means (26) calculates the correction of the SOC for equalizing the estimated voltage Vest to the measured voltage Vmes measured by voltage sensing means (12), and an adder (28) adds the correction to the pseudo-SOC to estimate the SOC of the battery.

12 Claims, 10 Drawing Sheets

MEANS FOR ESTIMATING CHARGED STATE OF BATTERY AND METHOD FOR ESTIMATING DEGRADED STATE OF BATTERY

TECHNICAL FIELD

The present invention relates to a means for estimating the state of charge of a battery, especially by using a battery model to minimize an estimation error, and an improved method for estimating the degraded state of battery (battery condition).

RELATED ART

A method for estimating state of charge (SOC) of a battery by adding an integrated value of charging/discharging current to an initial SOC of the battery has conventionally been known. With this method, however, it is difficult to accurately estimate the SOC of a battery because of factors such as the error inherent in integration of the charging/discharging current values, the accumulation of such error, change in the initial SOC due to self-discharge when the battery is not used, and so on.

To improve accuracy of estimation, a method for estimating the SOC also from a voltage of a battery and correcting the estimation result of the SOC obtained by integrating the charging/discharging current values has also been studied. For example, Japanese Patent Laid-Open Publication Hei 9-96665 discloses such an improved estimation method.

However, even by using the method for estimating the SOC from the battery voltage and correcting the integration error of the charging/discharging current values, it remains difficult to ensure a high estimation accuracy because there is no simple and accurate method for estimating the SOC from the voltage of the battery.

FIG. 6 shows a relationship between current and voltage of a battery having an SOC of 68%. As indicated in FIG. 6, the current-voltage relationship of the battery is not linear and has a large hysteresis. If the SOC is estimated from this current-voltage relationship, a large error may result depending on where in the changes in current and voltages of the battery the SOC is judged. In FIG. 6, although the real SOC is 68%, the SOC is judged to be 80% during increase of the charging current, and the SOC is judged to be 20% during increase of the discharging current.

As such, a significant estimation error is produced if the SOC is estimated based on the battery voltage, because, even if the SOC is unchanged, the voltage of the battery changes widely reflecting the charging/discharging state of the battery immediately before the voltage is measured. Thus, accurate estimations of the SOC could not be realized by any conventional method. The estimation error of the SOC is particularly large in a hybrid vehicle where the battery repeats charging and discharging in short cycles.

In the case of a battery used in an electric vehicle or the like, the degraded level of the battery is estimated in order to determine the replacement timing of the battery or to predict occurrence of troubles.

The state of decay of a battery can be measured out by determining the internal resistance of the battery. The internal resistance may be determined, for example, from the voltage of the battery after discharging a predetermined amount of discharging current for a certain period of time from the battery in a predetermined state of charge (SOC). In electric vehicles, it is also possible to determine the internal resistance R from several current/voltage values, while the vehicle is driven, by $$Vb = -R \cdot Ib + Voc \quad (1)$$

where Vb is a voltage value, Ib is a current value, and Voc is an open voltage.

In the above method where a predetermined amount of discharging current is discharged for a certain period of time from the battery having the predetermined SOC, measurement is done offline. Therefore, if the battery is used, for example, in an electric vehicle, it is impossible to estimate the internal resistance of the battery while the vehicle is driven.

On the other hand, by the method for determining the internal resistance of the battery using the above equation (1), it is possible to determine the internal resistance of the battery while the electric vehicle is driven. However, the influence of polarization of the battery is not considered in this method, so that a significant estimation error may be present in the obtained internal resistance. More specifically, the charging/discharging current of the battery is correlated to the voltage of the battery as shown in FIG. 10, in which the discharging state is indicated by positive current values and the charging state is indicated by negative current values. As shown in FIG. 10, the current/voltage characteristic of the battery includes hysteresis, so that a gradient between voltage and current, i.e., the internal resistance (-R), is changed depending on the measurement timing. This happens because the polarization is not considered, as described above. Thus, this conventional method can not be used to simply and accurately estimate the internal resistance of the battery.

In view of the above, an object of the present invention, therefore, is to provide a means for estimating the charged state of a battery capable of accurately estimating an SOC even though the battery repeats charging/discharging in short cycles.

Another object of the present invention is to provide a method for estimating the degraded state of battery capable of accurately measuring variations of internal resistance of the battery while the battery is used and of correctly ascertaining the degraded state of battery.

DISCLOSURE OF THE INVENTION

To achieve the above objects, there is provided in the present invention a means for estimating the charged state of a battery, in which a battery model is provided for determining a pseudo-SOC (state of charge) as a temporary value representative of the SOC of the battery, and voltage of the battery is estimated by considering the pseudo-SOC and a change in the state of the battery, whereby a real SOC is estimated by correcting the pseudo-SOC so that the estimated battery voltage is equal to an actually measured battery voltage.

In the means for estimating the charged state of the battery, the battery model includes a pseudo-SOC estimating means for determining the pseudo-SOC from charging/discharging current of the battery; an electromotive force estimating means for estimating the voltage of the battery based on the pseudo-SOC output from the pseudo-SOC estimating means; a voltage change estimating means for estimating a change in the voltage of the battery caused by internal resistance; and a dynamic voltage change estimating means for estimating a change in the voltage of the battery based on a change in charging/discharging current of the battery, whereby the battery voltage is estimated from the sum of output values of the electromotive force estimating means, the voltage change estimating means, and the dynamic voltage change estimating means.

In the means for estimating the charged state of the battery, the correction of the pseudo-SOC consists of a component proportional to a difference between the estimated battery voltage and the actually measured battery voltage, and a component proportional to an integrated value of the difference.

In the means for estimating the charged state of the battery, the pseudo-SOC estimating means, the electromotive force estimating means, the voltage change estimating means, and the dynamic voltage change estimating means carry out correction during respective estimating operations in accordance with a temperature of the battery.

In the means for estimating the charged state of the battery, the pseudo-SOC estimating means, the electromotive force estimating means, the voltage change estimating means, and the dynamic voltage change estimating means carry out correction during respective estimating operations in accordance with the estimated SOC of the battery.

In the means for estimating the charged state of the battery, the dynamic voltage change estimating means is formed by a neural network having a feedback path.

In another aspect of the present invention, there is provided a method for estimating the degraded state of battery, including the steps of measuring charging/discharging current and a voltage of the battery; determining a pseudo-SOC (state of charge) of the battery as a value representative of estimated SOC of the battery from an integrated value of the charging/discharging current; estimating an open voltage Voc of the battery from the pseudo-SOC; estimating a dynamic voltage change Vdyn of the battery based on a change in the charging/discharging current of the battery; determining a difference Vr between the sum of the open voltage Voc and the dynamic voltage change Vdyn, and the measured voltage Vmes of the battery by $$Vr = Vmes - (Voc + Vdyn)$$

and determining internal resistance of the battery from the difference Vr and the charging/discharging current by the least-squares method.

In the method for estimating the state of decay of the battery, the least-squares method may be a weighted least-squares method.

BEST MODE FOR CARRYING OUT THE INVENTION

Preferred embodiments (simply referred to as "embodiments" hereinafter) of the present invention will be described below with reference to the accompanying drawings.

Embodiment 1

Figure 1:
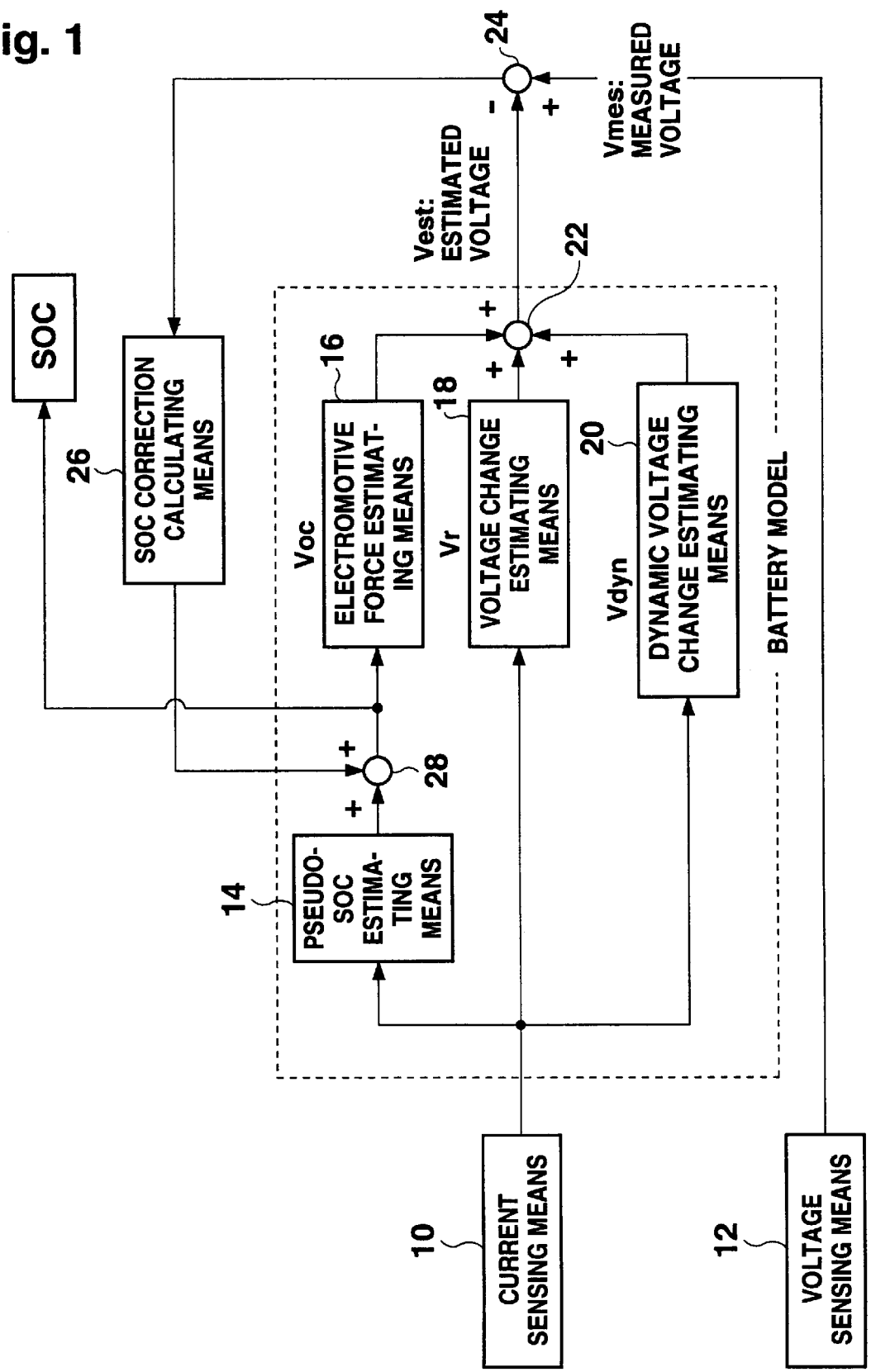
FIG. 1 is a block diagram showing the configuration of a first embodiment of a means for estimating the state of charge of a battery according to the present invention.

FIG. 1 is a block diagram showing the configuration of a first embodiment of a means for estimating the charged state of a battery according to the present invention. In FIG. 1, a current sensing means 10 detects the charging/discharging current of the battery. At the same time, a voltage sensing means 12 detects the voltage of the battery.

The value of the charging/discharging current detected by the current sensing means 10 is integrated in a pseudo-SOC estimating means 14 and added to a predetermined initial SOC value of the battery in order to estimate a pseudo-SOC as a temporary SOC value. The initial SOC value is 100% if the battery is fully charged, or is given as an estimated SOC value at the end of the previous use of the battery. Based on the pseudo-SOC, an electromotive force estimating means 16 estimates the voltage of the battery corresponding to the pseudo-SOC. The battery voltage estimated by the electromotive force estimating means 16 is an estimated open voltage Voc of the battery. The open voltage Voc is estimated by, for example, using a predetermined map of SOC and open voltage for each battery, and determining the open voltage Voc corresponding to the pseudo-SOC supplied from the pseudo-SOC estimating means 14.

A voltage change estimating means 18 estimates a voltage change caused by internal resistance of the battery from the value of the charging/discharging current of the battery detected by the current sensing means 10. The voltage change estimating means 18 estimates the voltage change of the battery caused by the internal resistance by $$Vr = -r \cdot Ib$$

where r is an internal resistance, and Ib is a current value (positive values for discharging current).

Vr represents the voltage change caused by the internal resistance estimated by the voltage change estimating means 18. The internal resistance r of the battery is predetermined for each battery. The current value Ib is a value of the charging/discharging current detected by the current sensing means 10.

In addition, a dynamic voltage change estimating means 20 estimates a voltage change of the battery caused by a change in the charging/discharging current of the battery. In the dynamic voltage change estimating means 20, a dynamic voltage change Vdyn of the battery is estimated by $$Vdyn = C \cdot x \quad dx/dt = A \cdot x + B \cdot Ib$$

where A, B, and C are coefficient matrixes, and x is a quantity of state.

The dynamic voltage change estimating means 20 estimates a transient voltage change Vdyn of the battery based on the above state equation. In this case, the coefficient matrixes A, B, and C are determined for each battery from measurements of each battery's characteristics.

Then, an adder 22 sums the output values of the electromotive force estimating means 16, the voltage change estimating means 18, and the dynamic voltage change estimating means 20 to produce an estimated voltage Vest as an estimated battery voltage. that is, $$Vest=Voc+Vr+Vdyn$$

It should be noted that the pseudo-SOC estimating means 14, the electromotive force estimating means 16, the voltage change estimating means 18, the dynamic voltage change estimating means 20, and the adder 22, which are described above, form a battery model according to the present invention.

A comparator 24 compares the estimated voltage Vest of the battery estimated in the battery model with an actually measured voltage Vmes of the battery detected by the voltage detecting means 12, and supplies a difference between the two values to an SOC correction calculating means 26 which then calculates an estimated SOC value of the battery by $$SOC=SOCp+Kp(Vmes-Vest)+Ki \cdot \int (Vmes-Vest)dt$$

where SOCp is a pseudo-SOC, and Kp and Ki are coefficients.

In the above equation, the pseudo-SOC (SOCp) is an output value of the pseudo-SOC estimating means 14. The SOC correction calculating means 26 calculates the second and third terms of the above equation, i.e., a component proportionate to the difference between the estimated voltage Vest and the measured voltage Vmes (Vmes−Vest) determined by the comparator 24, and a component proportionate to the integrated value of such a difference. Coefficients Kp, Ki are predetermined from the battery characteristics. As indicated in the equation, each component calculated by the SOC correction calculating means 26 is added by the adder 28 to the output value SOCp of the pseudo-SOC estimating means 14, whereby the estimation value of the SOC of the battery is provided.

As described above, in this embodiment, the present invention utilizes the battery model to estimate the battery voltage by estimating the electromotive force of the battery from the pseudo-SOC determined by the method similar to the conventional method, while estimating the voltage change caused by the internal resistance of the battery voltage and the dynamic voltage change caused by the change in the charging/discharging current, and summing up these estimated values. More particularly, the battery model estimates the battery voltage Vest by considering the pseudo-SOC and the change in state of the battery. Then, the pseudo-SOC is corrected so that the estimated voltage Vest is equal to the actually measured battery voltage Vmes, thereby estimating the SOC of the battery. Thus, the correction of the SOC is carried out by considering not only the integrated charging/discharging current but also the changes in the internal resistance and the battery state, so that the estimation accuracy of the battery SOC can be improved significantly.

In this embodiment, because the pseudo-SOC is corrected so that the estimated voltage Vest is equal to the actually measured battery voltage Vmes, it is possible to provide the correct SOC value quickly even if a large error exists in the initial SOC value.

Figure 2:
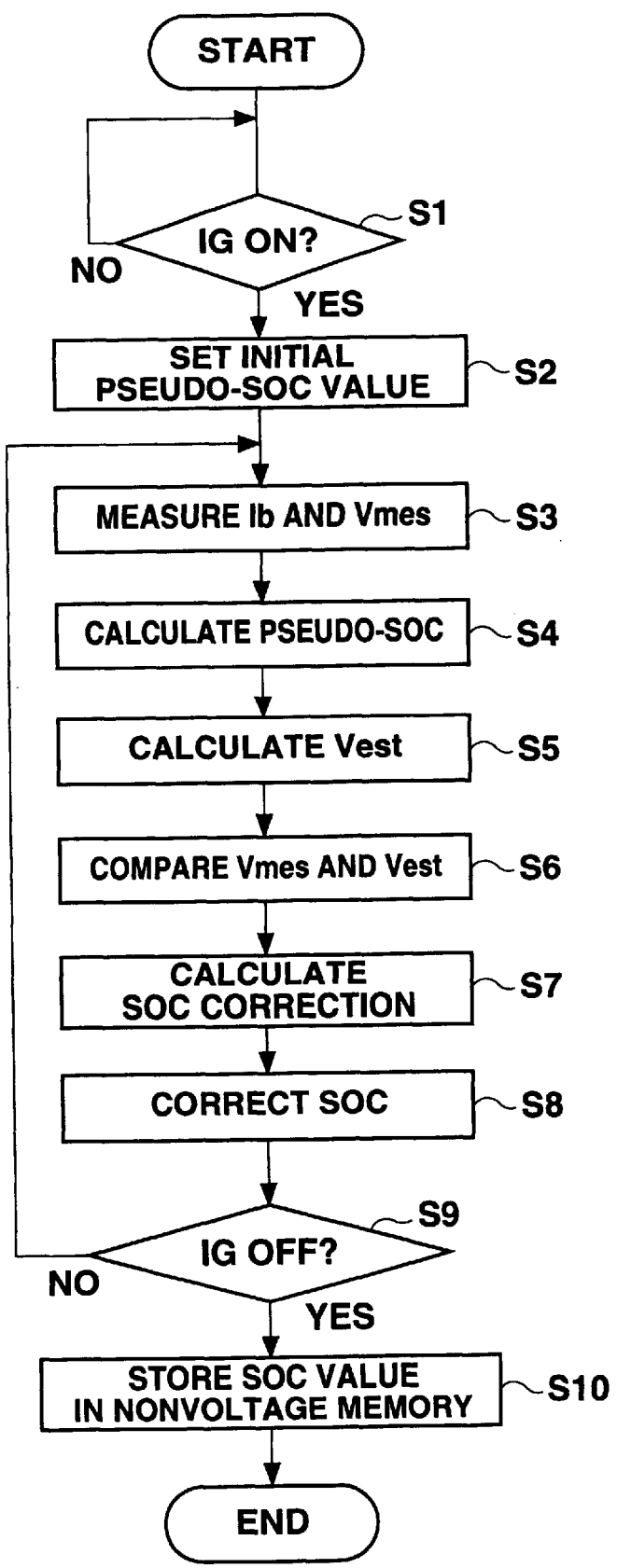
FIG. 2 is a flowchart showing the process for estimating the SOC of the battery by the means for estimating the charged state a battery of FIG. 1.

FIG. 2 is a flowchart showing the SOC estimating operation carried out by the means for estimating the charged state of the battery of FIG. 1. In FIG. 2, when an ignition switch is turned on (S1), a pseudo-SOC value is set by the pseudo-SOC estimating means 14 as a temporary value representative of the state of charge of the battery, which is determined depending on whether or not the battery is in full charge, or otherwise determined from the estimated SOC value at the end of the last use of the battery (S2).

Then, the current sensing means 10 and the voltage sensing means 12 measure a charging/discharging current value Ib and a real voltage Vmes of the battery, respectively (S3).

By integrating the charging/discharging current value Ib detected by the current sensing means 10, the pseudo-SOC estimating means 14 calculates the pseudo-SOC (S4). From the pseudo-SOC estimated by the pseudo-SOC estimating means 14, the electromotive force estimating means 16 estimates the open voltage Voc of the battery. From the charging/discharging current value Ib of the battery detected by the current sensing means 10, the voltage change estimating means 18 estimates the voltage change Vr caused by the internal resistance. The dynamic voltage change estimating means 20 estimates the voltage change Vdyn caused by the change in the charging/discharging current of the battery. Then, the estimated voltage Vest of the battery is calculated by summing the open voltage Voc, the voltage change Vr caused by the internal resistance, and the voltage change Vdyn caused by the change in the charging/discharging current of the battery (S5).

Then, the comparator 24 compares the estimated voltage Vest calculated as above with the measured voltage Vmes of the battery actually measured by the voltage sensing means 12 (S6). Based on the difference between vmes and Vest derived from the comparison in the comparator 24, the SOC correction calculating means 26 calculates the correction of the pseudo-SOC estimated by the pseudo-SOC estimating means 14 (S7).

The adder 28 adds the SOC correction calculated by the SOC correction calculating means 26 to the pseudo-SOC to correct the pseudo-SOC, to calculate the estimated SOC value (S8).

Next, it is determined whether or not the ignition switch is turned off and, if not, the above steps S3–S8 are repeated until the ignition switch is turned off (S9).

When the ignition switch is turned off in S9, the estimated SOC value of the battery at that point of time is stored in a non-volatile memory and will be used as the next initial pseudo-SOC value (Sl0).

Thus, the SOC estimation operation of the battery by using the means for estimating the charged state of the battery according to this embodiment is terminated.

Embodiment 2

Figure 3:
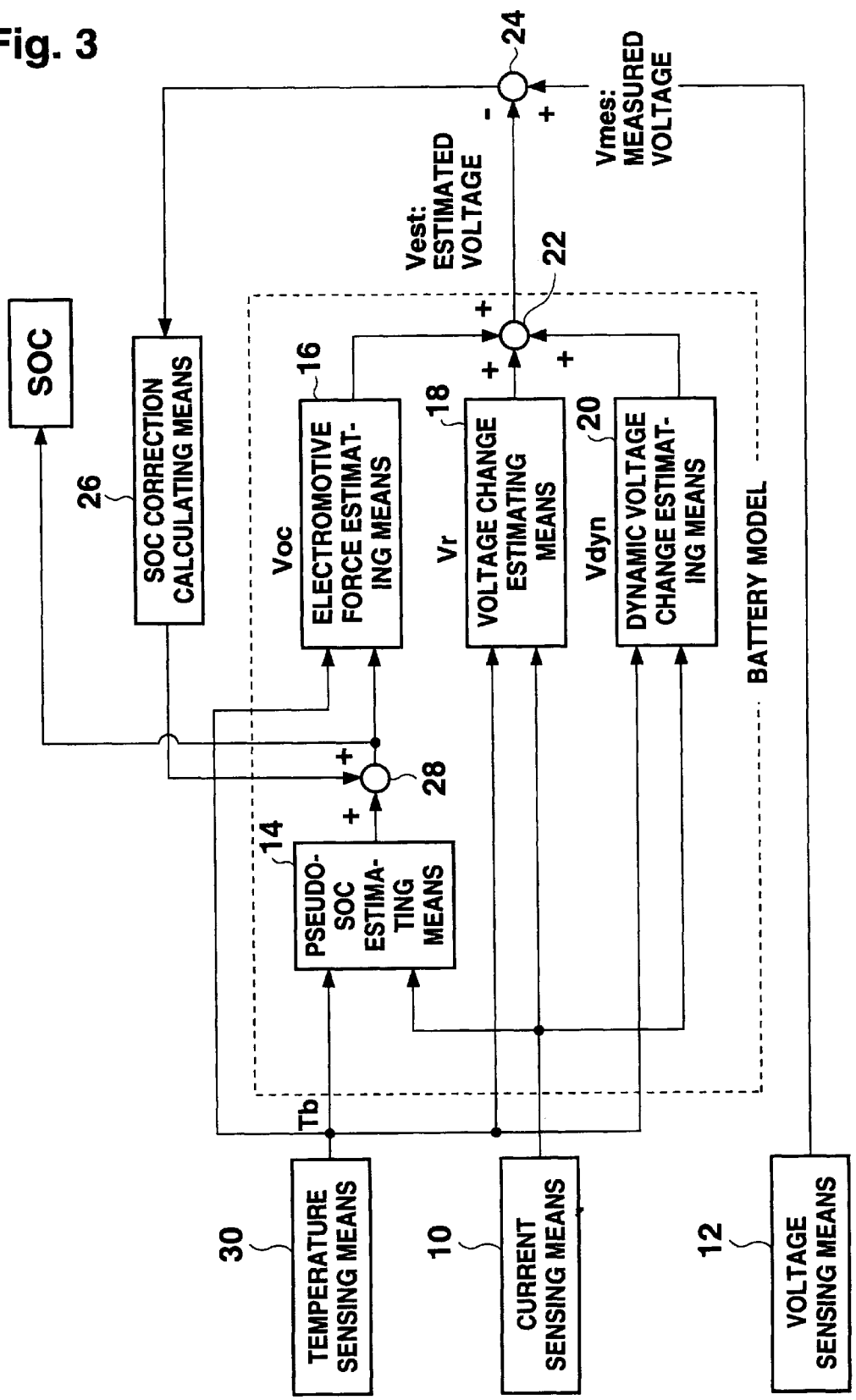
FIG. 3 is a block diagram showing the configuration of a second embodiment of the means for estimating the charged state of a battery according to the present invention.

FIG. 3 is a block diagram showing the configuration of a second embodiment of the means for estimating the charged state of a battery according to the present invention. In the following description, elements corresponding to those already described for FIG. 1 are denoted with corresponding reference numbers and their description will not be repeated. The configuration of FIG. 3 is characterized in that when the pseudo-SOC estimating means 14, the electromotive force estimating means 16, the voltage change estimating means 18, and the dynamic voltage change estimating means 20 carry out respective estimating operations, correction is carried out in consideration of a battery temperature Tb. More particularly, this embodiment includes a temperature sensing means 30 for sensing a temperature of the battery, and the output value thereof is supplied to the pseudo-SOC estimating means 14, the electromotive force estimating means 16, the voltage change estimating means 18, and the dynamic voltage change estimating means 20, respectively.

In general, battery characteristics vary with the temperature of the battery. Therefore, by supplying the temperature information Tb of the battery to individual estimating means of the battery model, it is possible to estimate the SOC of the battery more accurately. It should be noted that the nature of correction carried out by individual estimating means using the battery temperature Tb sensed by the temperature sensing means 30 is predetermined according to the battery characteristics.

Embodiment 3

Figure 4:
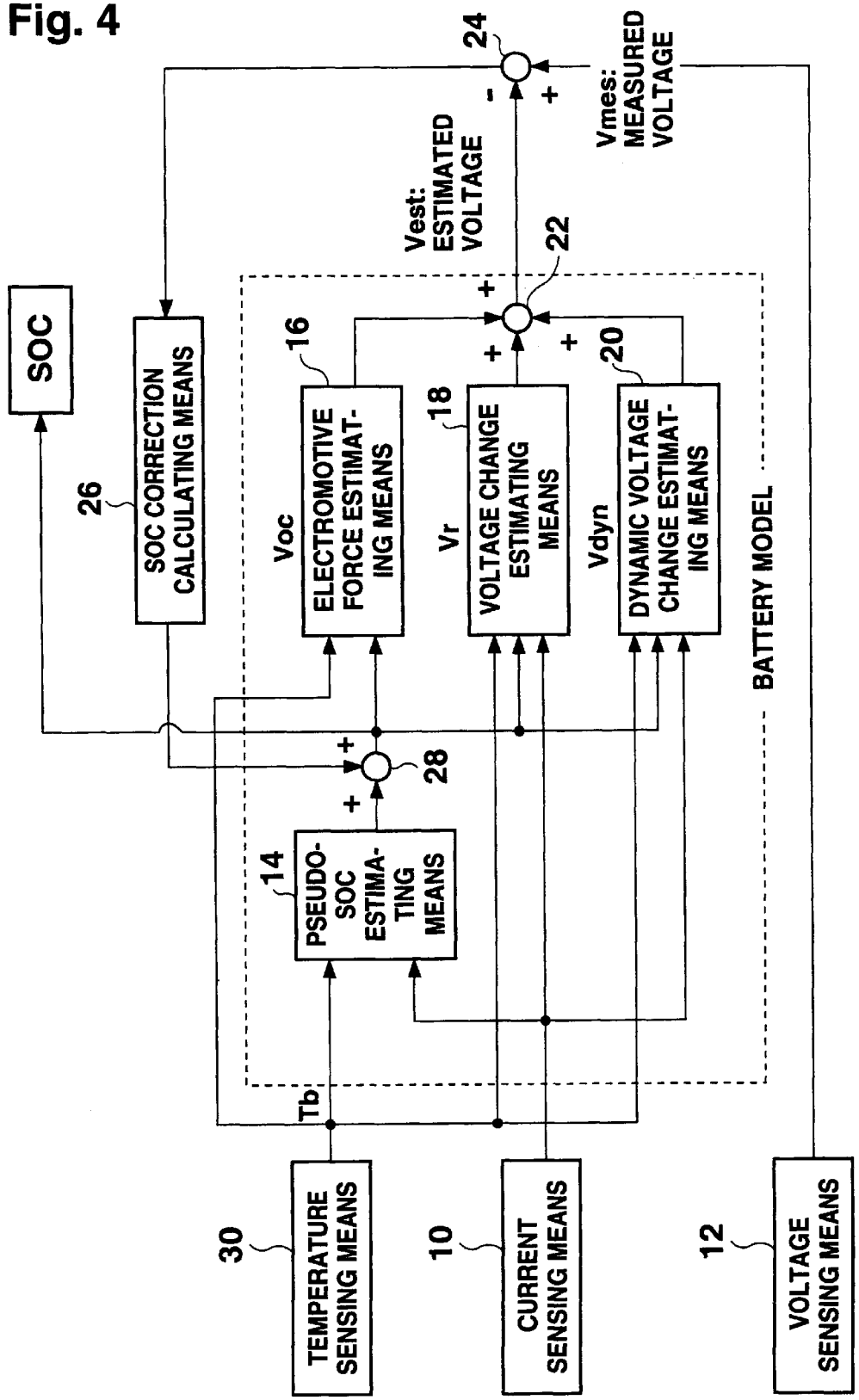
FIG. 4 is a block diagram showing the configuration of a third embodiment of the means for estimating the charged state of a battery according to the present invention.

FIG. 4 is a block diagram showing the configuration of a third embodiment of the means for estimating the charged state of a battery according to the present invention. In the following description, elements corresponding to those already described for FIGS. 1 or 3 are denoted with corresponding reference numbers and their description will not be repeated. The configuration of FIG. 4 is characterized in that, when respective estimating operations are carried out in the battery model, correction is carried out corresponding to the estimated SOC value obtained by correcting the pseudo-SOC. More particularly, the SOC of the battery is estimated by adding the SOC correction calculated by the SOC correction calculating means 26 to the pseudo-SOC by the adder 28, and the estimated SOC value is supplied to the electromotive force estimating means 16, the voltage change estimating means 18, and the dynamic voltage change estimating means 20, respectively, to correct estimating operations of these means. In this way, the change in battery characteristics caused by the change of SOC can be considered, such that the SOC estimation is carried out more accurately. It should be noted that the nature of correction carried out by individual estimating means is predetermined according to the battery characteristics, as in the second embodiment.

Embodiment 4

Figure 5:
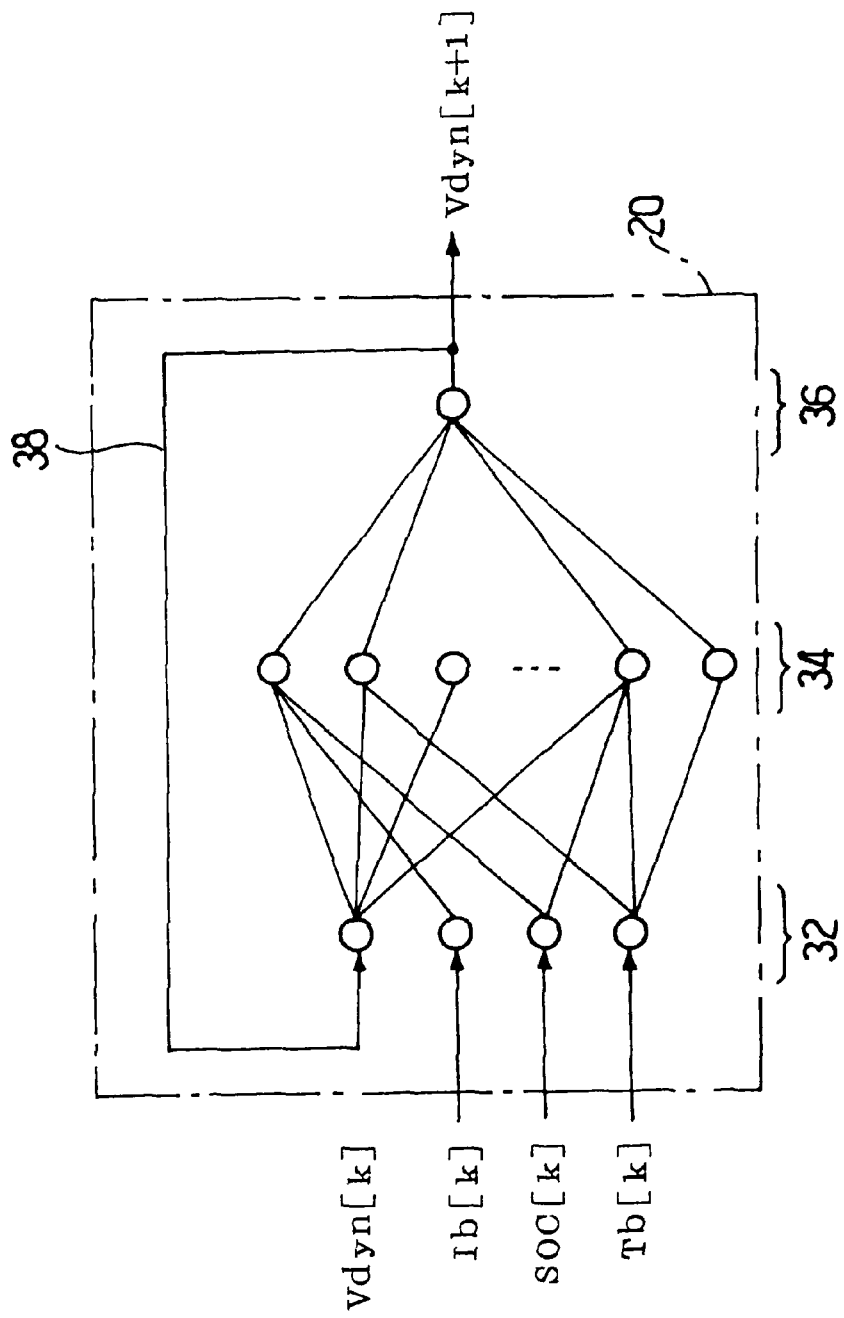
FIG. 5 shows a modified implementation of the dynamic voltage change estimating means used in a fourth embodiment of the means for estimating the charged state of a battery according to the present invention.
Figure 6:
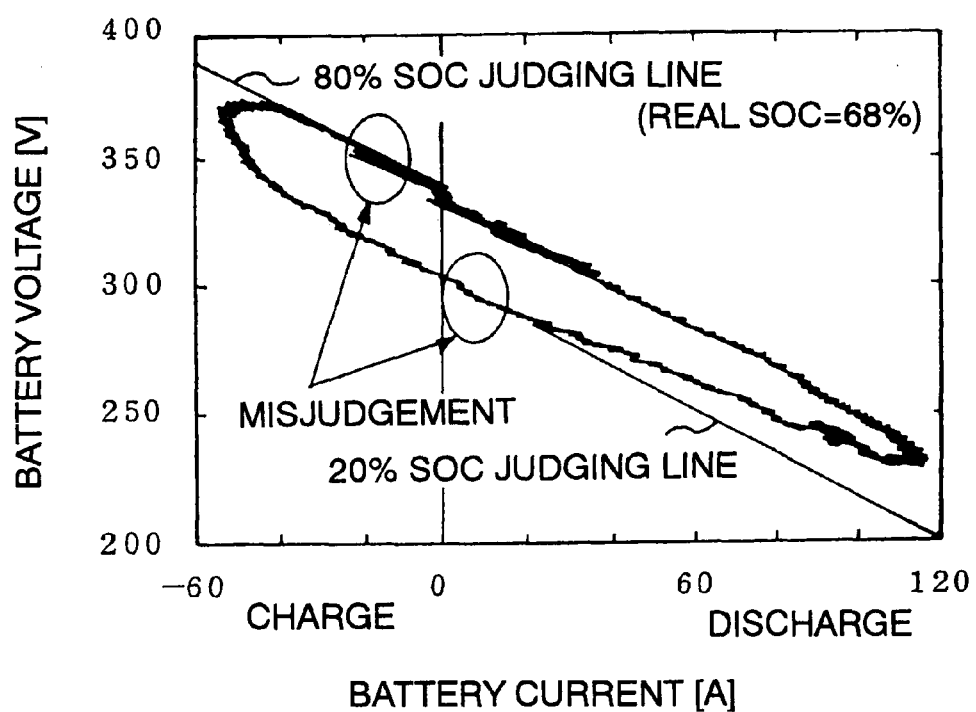
FIG. 6 is a graph showing changes of voltage and current of a battery.

FIG. 5 shows a modified implementation of the dynamic voltage change estimating means 20 used in a fourth embodiment of the means for estimating the charged state of a battery according to the present invention. It should be noted that the elements which are not illustrated in FIG. 5 are the same as those in the first, second, and third embodiments illustrated in FIGS. 1, 3, and 4, respectively.

In FIG. 5, the dynamic voltage change estimating means 20 is configured as a neural network. The neural network consists of an input layer 32, an intermediate layer 34, and an output layer 36. Each unit of the input layer 32 being coupled with all or part of the units of the intermediate layer 34, and all or part of the units of the intermediate layer 34 are then coupled with each unit of the output layer 36.

The neural network shown in FIG. 5 is characterized in that this is a recurrent type network including a feedback path 38 from the output layer 36 to the input layer 32.

The dynamic voltage change Vdyn of the battery estimated by the dynamic voltage change estimating means 20 is written in discrete form as $$\text{Vdyn }[k+1]=f(Ib\ [k],\text{SOC}\ [k],\ Tb\ [k],\ \text{Vdyn}\ [k])$$

where f is a function. As indicated in this equation, the dynamic voltage change Vdyn is expressed in terms of two time steps [k] and [k+1]. When applied to the neural network, it is therefore necessary to use the above-mentioned recurrent type neural network.

In the above equation, the dynamic voltage change Vdyn [k+1] is expressed as the function f with Ib [k],SOC [k], Tb [k], and Vdyn [k] being variables. The type of the function f is determined by training the neural network.

The input layer 32 of the neural network receives a feedback term Vdyn [k] at a given time step k, the charging/discharging current value Ib [k] detected by the current sensing means 10, the estimated SOC [k] obtained by adding the SOC correction calculated by the SOC correction calculating means 26 to the pseudo-SOC in the adder 28, and the battery temperature Tb [k] sensed by the temperature sensing means 30. In response to the input of the data, the output layer 36 outputs the voltage change Vdyn [k+1] at a time step [k+1] via the predetermined intermediate layer 34. If the neural network of this embodiment is incorporated in the means for estimating the charged state of a battery illustrated in FIGS. 1 and 3, respectively, only the charging/discharging current value Ib [k] is input in FIG. 1, and the charging/discharging current value Ib [k] and the battery temperature Tb [k] are input in FIG. 3.

With this configuration, the neural network is trained by supplying teacher data having a non-linear characteristic based on the chemical reactions within the battery to the input layer 32. As the network is trained, the size of the couplings among individual units is changed, so that the neural network has couplings capable of responding to the non-linear characteristic of the battery. More particularly, the dynamic voltage change Vdyn [k+1] is, as mentioned above, determined by the function f using the individual input data to the neural network as variables and, since this is not a simple linear function, the non-linear characteristic of the battery can be expressed more faithfully.

The dynamic voltage change estimating means 20 of this embodiment having a particularly strong non-linear characteristic in the battery is thus formed by the recurrent type neural network capable of sufficiently responding to the non-linear characteristic of the battery, such that a more accurate battery model can be provided and the charged state of a battery can be accurately estimated.

Embodiment 5

Figure 7:
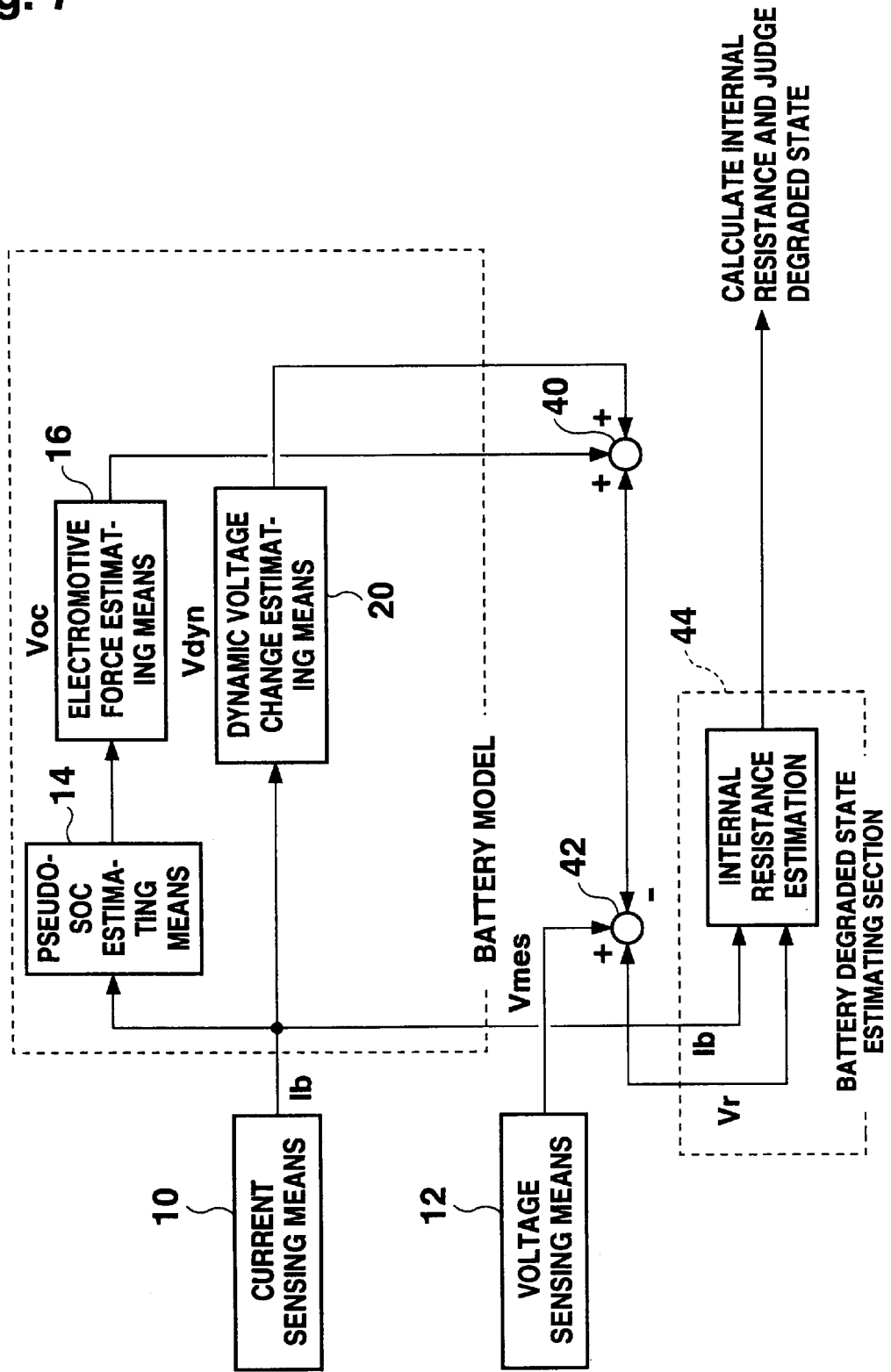
FIG. 7 is a block diagram showing the configuration for implementing a method for estimating the degraded state of battery according to the present invention.

FIG. 7 is a block diagram showing the configuration for implementing a method for estimating the degraded state of battery according to the present invention. As described above, the state of decay of the battery appears as a change in the internal resistance, so that it is possible to estimate the state of decay of the battery by monitoring the internal resistance.

In FIG. 7, the current sensing means 10 measures the charging/discharging current value Ib of the battery, and the voltage sensing means 12 measures the voltage of the battery (Vmes). The pseudo-SOC estimating means 14 integrates the charging/discharging current value Ib detected by the current sensing means 10, and adds it to the predetermined initial SOC value of the battery to provide the estimated SOC value or the pseudo-SOC. The initial SOC value may be determined, for example, by assuming the full-charge state of the battery be 100%. Based on the pseudo-SOC determined as such, the electromotive force estimating means 16 estimates the battery voltage corresponding to the pseudo-SOC. The battery voltage estimated by the electromotive force estimating means 16 is the estimated open voltage Voc of the battery. Such an open voltage Voc is estimated, for example, by using a predetermined map of SOC and open voltage for each battery and determining the open voltage Voc corresponding to the pseudo-SOC supplied from the pseudo-SOC estimating means 14.

The voltage of the battery is changed dynamically in accordance with changes in the charging/discharging current of the battery. The dynamic voltage change estimating means 20 estimates such a dynamic voltage change of the battery. In the dynamic voltage change estimating means 20, the dynamic voltage change Vdyn of the battery is estimated by $$Vdyn = C \cdot x \; dx/dt = A \cdot x + B \cdot Ib \qquad (2)$$

where A, B, and C are coefficient matrixes and x is a quantity of state.

The dynamic voltage change estimating means 20 estimates the transient voltage change Vdyn of the battery according to the above state equation. Each coefficient matrix A, B and C is predetermined for each battery by measuring its characteristics. Thus, this embodiment utilizes the battery model consisting of the pseudo-SOC estimating means 14, the electromotive force estimating means 16, and the dynamic voltage change estimating means 20 to estimate the open voltage Voc and the dynamic voltage change Vdyn of the battery based on the charging/discharging current value Ib of the battery detected by the current sensing means 10.

The adder 40 sums the open voltage Voc and the dynamic voltage change Vdyn of the battery estimated above by the battery model, and a subtractor 42 calculates a difference Vr between the sum and the actually measured battery voltage Vmes mesured by the voltage sensing means 12. That is, $$Vr = Vmes - (Voc + Vdyn) \qquad (3)$$

Vr is thus determined by subtracting, from the measured voltage Vmes of the battery, the electromotive force or the open voltage Voc of the battery corresponding to the SOC at the time of the measurement, and the dynamic voltage change Vdyn based on the change in the charging/discharging current, so that Vr represents the voltage change caused by the internal resistance of the battery. By determining the relationship between the Vr and the charging/discharging current value Ib detected by the current sensing means 10 by the least-squares method, the internal resistance of the battery can be obtained as a gradient of the relationship. In this way, a battery state of decay estimating section 44 estimates the internal resistance of the battery.

Instead of simply plotting the relationship between the measured battery voltage Vmes and the charging/discharging current value Ib and determining the internal resistance from the gradient of the relationship, this embodiment estimates the internal resistance by removing the voltage change of the battery caused by the change in SOC and the change in the charging/discharging current of the battery to only extract the voltage change caused by the internal resistance, so that the estimation of the internal resistance of the battery can be carried out with high accuracy. As a result, the state of decay of the battery can be known correctly. By estimating the changes in the internal resistance of the battery, it is also possible to detect other abnormal conditions, such as short circuit of the battery or breaking of wires.

A typical least-squares method requires a large memory during calculation because all of the past current values have to be summed up and stored. It is, therefore, preferable to adopt the weighted least-squares method incorporating exponential heights (forgetting factor $\rho: 0 < \rho < 1$). In a discrete form, $$R_n = \frac{\rho \sum_{i=0}^{n-1} \rho^{n-1} I_i^2}{\rho \sum_{i=0}^{n-1} \rho^{n-1} I_i^2 + I_{n-1}^2} + \frac{I_{n-1} V r_n}{\rho \sum_{i=0}^{n-1} \rho^{n-1} I_i^2 + I_{n-1}^2} \qquad (4)$$

where R is the internal resistance of the battery, I is the measured current, Vr is the measured current—the open circuit voltage—the dynamic voltage change, n is the nth sample, and $\rho$ is an exponential weight ($0 < \rho < 1$, forgetting factor).

It should be noted that the charging/discharging current detected by the current sensing means 10 is indicated as I instead of Ib in the above equation.

Figure 8:
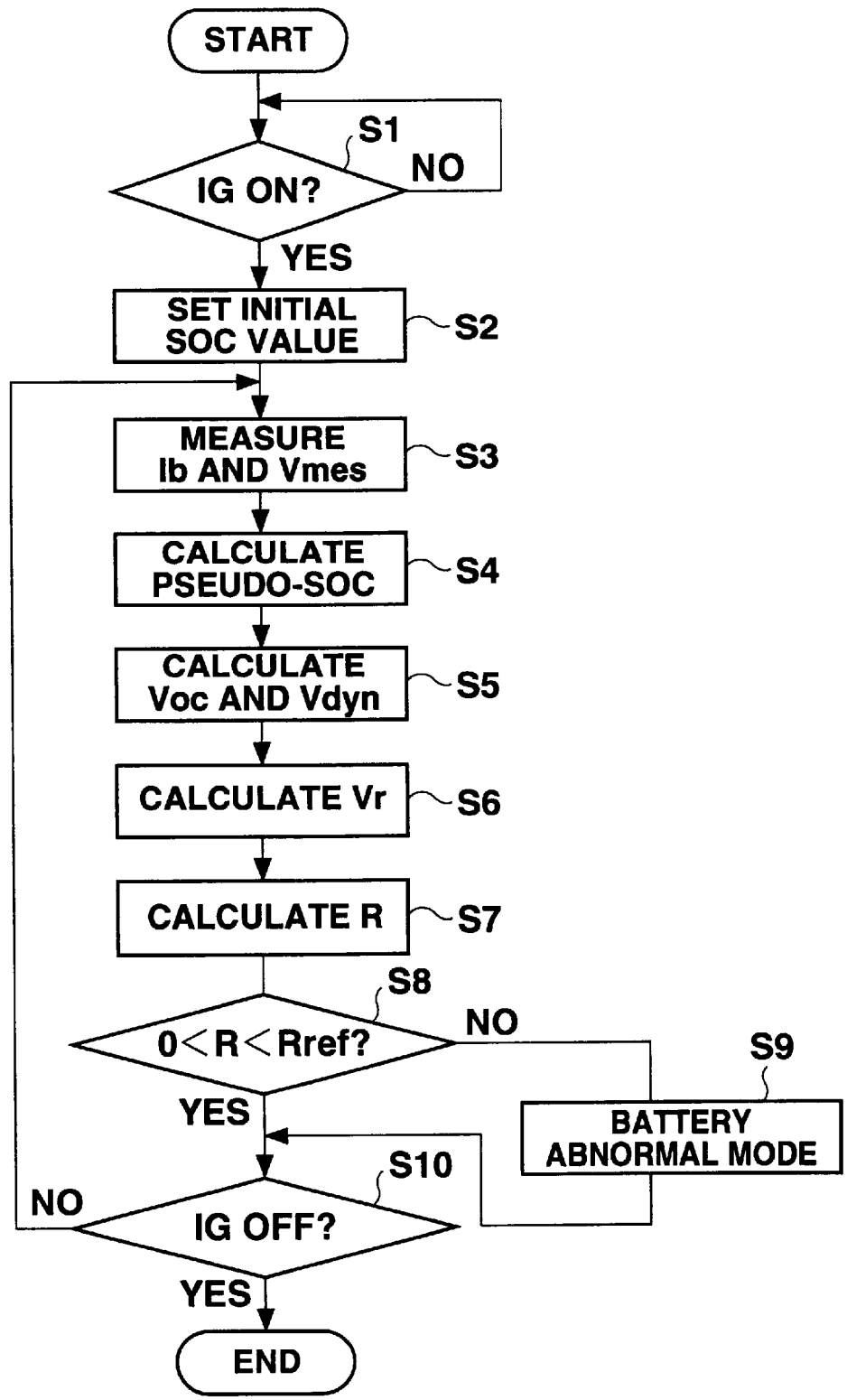
FIG. 8 is a flowchart showing the steps of the method for estimating the degraded state of battery according to the present invention.

FIG. 8 is a flowchart showing the steps of a method for estimating the state of decay of battery according to the present invention. In FIG. 8, whether or not the ignition switch is turned on is checked (S1) and, upon turning on of the switch, the initial SOC value is set in the pseudo-SOC estimating means 14 (S2).

Then, the current sensing means 10 and the voltage sensing means 12 measure the charging/discharging current value Ib and the voltage Vmes, respectively (S3).

The pseudo-SOC estimating means 14 integrates the charging/discharging current value Ib and adds the integrated value to the initial SOC value set in S2 in order to calculate the pseudo-SOC (S4). The electromotive force estimating means 16 calculates the open voltage Voc of the battery by using the pseudo-SOC. At the same time, the dynamic voltage change estimating means 20 calculates the dynamic voltage change Vdyn of the battery based on the change in the charging/discharging current (S5).

From the Voc and the Vdyn determined in S5 and the measured battery voltage Vmes measured by the voltage sensing means 12, Vr is calculated according to the above equation (3) (S6). From the Vr and the charging/discharging current value Ib detected by the current sensing means 10, the internal resistance R of the battery is calculated according to the above equation (4) (S7).

Next, whether or not the internal resistance R determined in S7 exceeds a predetermined value Rref is checked (S8). If the internal resistance R of the battery is greater than the Rref, it is predicted that the state of decay of the battery becomes worse or any other abnormal condition may have occurred, so that the battery enters the abnormal mode and sounds an alarm by a predetermined means (S9).

If the internal resistance R of the battery is determined to be smaller than the Rref in S8, or after the battery entered the abnormal mode in S9, whether or not the ignition switch is turned off is checked (S10). If the ignition switch is not turned off in S10, steps S3–S9 are repeated. When the ignition switch is turned off, the battery state of decay estimating operation is terminated.

Figure 9:
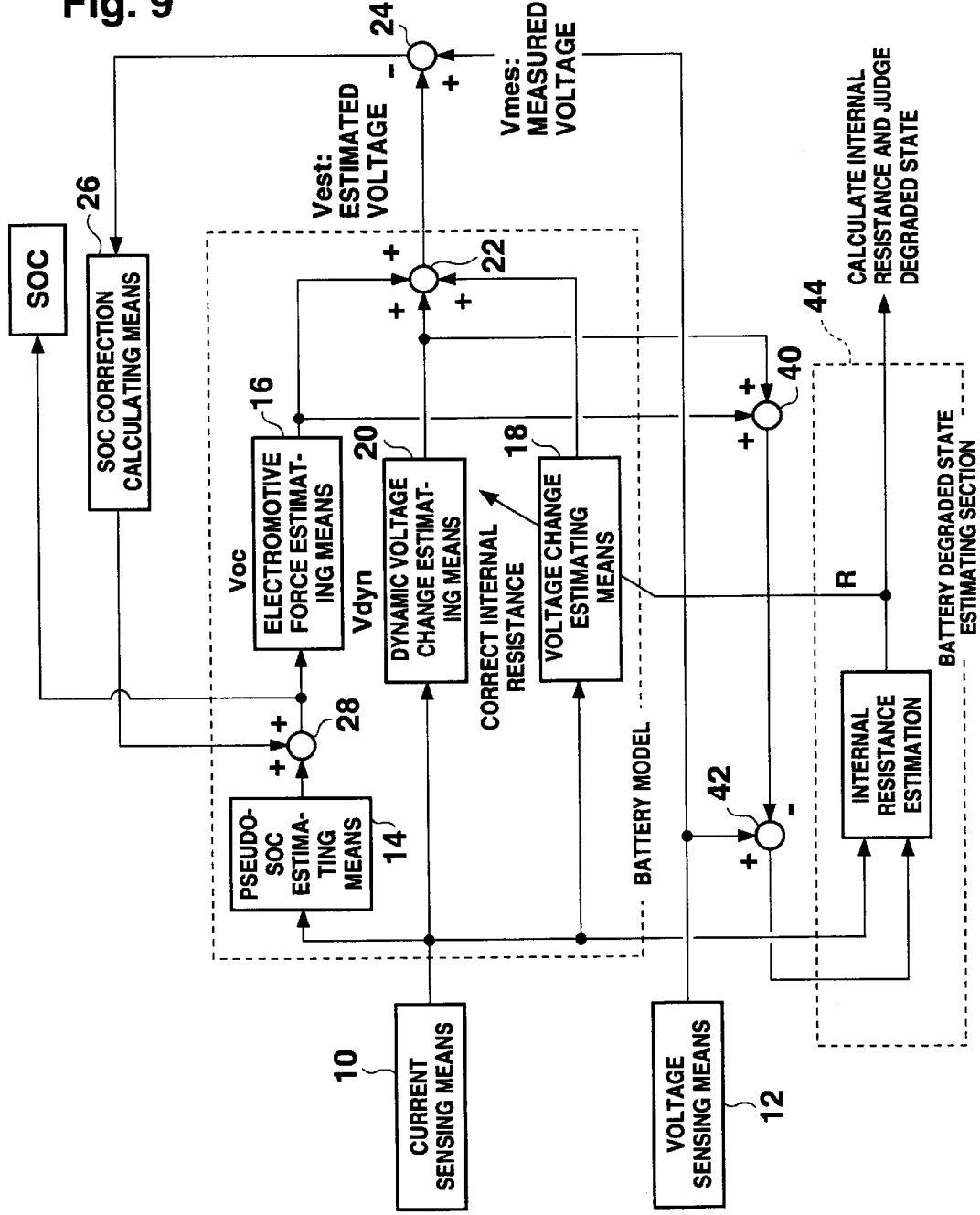
FIG. 9 is a block diagram showing the configuration for estimating the SOC of the battery using the internal resistance estimated by the method for estimating the state of decay of the battery according to the present invention.
Figure 10:
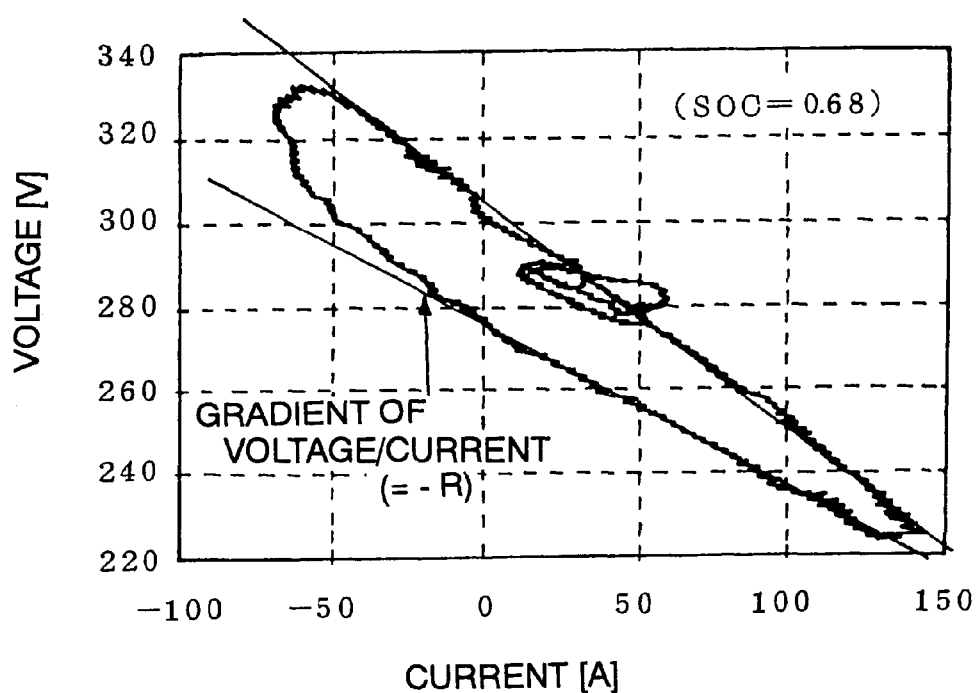
FIG. 10 is a graph showing a voltage-to-current relationship of a battery.

FIG. 9 is a block diagram showing the configuration of a means for estimating the SOC of the battery by using the internal resistance R, the open voltage voc, and the dynamic voltage change Vdyn of the battery estimated above. In the following description, elements corresponding to those already described for FIG. 7 are denoted with corresponding reference numbers and their description will not be repeated.

In FIG. 9, the internal resistance of a battery which was previously measured, such as at the time of production, for example, is corrected according to the estimated internal resistance R of the battery estimated by the battery state of decay estimating section 44. This is useful for constantly maintaining the internal resistance of the battery at a correct value in the battery model. From such an internal resistance R and the charging/discharging current value Ib of the battery detected by the current sensing means 10, the voltage change estimating means 18 estimates the voltage change caused by the internal resistance of the battery. In the voltage change estimating means 18, the voltage change of the battery caused by the internal resistance R is estimated by $$VR = -R \cdot Ib$$

where R is the internal resistance, and Ib is the current value (positive values for discharging current).

In the above expression, VR represents the voltage change caused by the internal resistance R estimated by the voltage estimating means 18. The current value Ib is the charging/discharging current value detected by the current sensing means 10.

Next, the adder 22 sums the output values of the electromotive force estimating means 16, the dynamic voltage change estimating means 20, and the voltage change estimating means 18 to determine the estimated voltage Vest representative of the estimated battery voltage, $$Vest = Voc + Vdyn + VR$$

It should be noted that the battery model is modeled after the actual battery by the pseudo-SOC estimating means 14, the electromotive force estimating means 16, the dynamic voltage change estimating means 20, the voltage change estimating means 18, and the adder 22.

The comparator 24 compares the estimated battery voltage Vest with the actually measured voltage Vmes detected by the voltage sensing means 12, and supplies the obtained difference between the two voltages to the SOC correction calculating means 26 which, in turn, calculates the correction of SOC so that the estimated voltage Vest is equal to the measured voltage Vmes. Thus, the estimated value of the battery SOC is given by $$SOC = SOCp + Kp(Vmes - Vest) + Ki \cdot \int (Vmes - Vest) dt$$

where SOCp is the pseudo-SOC, and Kp and Ki are coefficients.

In the above expression, the pseudo-SOC (SOCp) is the output value of the pseudo-SOC estimating means 14. The SOC correction estimating means 26 calculates the second and third terms of the above expression, that is, a component proportionate to the difference (Vmes−Vest) between the estimated voltage Vest and the measured voltage Vmes determined by the comparator 24, and a component proportionate to the integrated value of the difference. Coefficients Kp, Ki are predetermined from the battery characteristics. The adder 28 adds respective components calculated by the SOC correction calculating means 26 to the output value SOCp of the pseudo-SOC estimating means 14 to thereby provide the estimated SOC value of the battery.

As such, this embodiment utilizes the battery model to estimate the battery voltage by estimating the electromotive force of the battery from the pseudo-SOC, the voltage change caused by the internal resistance of the battery, and the dynamic voltage change caused by the change in the charging/discharging current, and summing up these input values. More particularly, the battery model is used to estimate the battery voltage Vest by considering the pseudo-SOC and the change in battery state. Next, the pseudo-SOC is corrected so that the estimated voltage Vest is equal to the battery voltage Vmes actually measured to thereby estimate the SOC of the battery. Thus, the SOC is corrected by considering the changes in the internal resistance and the battery state in addition to the integrated charging/discharging current. As a result, the estimation accuracy of the battery SOC is significantly improved. Because the internal resistance R of the battery used here is a corrected value corrected by the battery state of decay estimating section, the estimation accuracy of the SOC is further improved.

INDUSTRIAL APPLICABILITY

As described above, the present invention estimates the SOC of a battery by considering the dynamic state change of the battery, such as the change in the charging/discharging current of the battery, whereby it is possible to estimate the SOC with high accuracy even for the battery of a hybrid vehicle or the like where charging/discharging is switched and repeated in short cycles.

By using a recurrent type neural network as the dynamic voltage change estimating means having a particularly strong non-linear characteristic, the estimation accuracy of estimating the charged state of the battery can be further improved.

In addition, the accuracy of the estimation of the internal resistance can be improved by removing the change in the electromotive force caused by the change in the SOC and the dynamic voltage change caused by the change in the charging/discharging current from the measured battery voltage, and determining the voltage change only caused by the internal resistance of the battery. It is therefore possible to accurately estimate the internal resistance. As a result, the actual state of decay of the battery can be known.

What is claimed is:

1. Means for estimating a state of charge of a battery, comprising a battery model for determining a pseudo-SOC (state of charge) as a temporary value representative of the SOC of the battery and estimating a voltage of the battery by considering the pseudo-SOC and a change in state of the battery, whereby a real SOC is estimated by correcting the pseudo-SOC so that the estimated voltage of the battery is equal to an actually measured voltage of the battery, wherein the battery model includes:

pseudo-SOC estimating means for determining the pseudo-SOC from charging/discharging current of the battery, electromotive force estimating means for estimating the voltage of the battery in accordance with the pseudo-SOC output from the pseudo-SOC estimating means, voltage change estimating means for estimating a change in the voltage of the battery caused by internal resistance, and dynamic voltage change estimating means for estimating a change in the voltage of the battery based on a change in the charging/discharging current of the battery, wherein the voltage of the battery is estimated from the sum of output values of the electromotive force estimating means, the voltage change estimating means, and the dynamic voltage change estimating means.

2. Means for estimating a state of charge of a battery according to claim 1, wherein the correction of the pseudo-SOC consists of a component proportionate to a difference between the estimated battery voltage and the actually measured battery voltage, and a component proportionate to an integrated value of the difference.

3. Means for estimating a state of charge of a battery according to claim 1, wherein the pseudo-SOC estimating means, the electromotive force estimating means, and the dynamic voltage change estimating means carry out correction during respective estimating operations in accordance with a temperature of the battery.

4. Means for estimating a state of charge of a battery according to claim 1, wherein the pseudo-SOC estimating means, the electromotive force estimating means, and the dynamic voltage change estimating means carry out correction during respective estimating operations in accordance with the estimated SOC of the battery.

5. Means for estimating a state of charge of a battery according to claim 1, wherein the dynamic voltage change estimating means is formed by a neural network having a feedback path.

6. A method for estimating the degraded state of battery, comprising the steps of:

measuring charging/discharging current and a voltage of a battery;

determining a pseudo-SOC (state of charge) of the battery as a value representative of estimated SOC of the battery from an integrated value of the charging/discharging current;

estimating an open voltage Voc of the battery from the pseudo-SOC;

estimating a dynamic voltage change Vdyn of the battery based on a change in the charging/discharging current of the battery;

determining a difference Vr between the sum of the open voltage Voc and the dynamic voltage change Vdyn, and the measured voltage Vmes of the battery according to the expression $$Vr = Vmes - (Voc + Vdyn)$$

and determining internal resistance of the battery from the difference Vr and the charging/discharging current by the least-squares method.

7. A method for estimating the degraded state of battery according to claim 6, wherein the least-squares method is a weighted least-squares method.

8. Means for estimating a state of charge of a battery according to claim 2, wherein the pseudo-SOC estimating means, the electromotive force estimating means, and the dynamic voltage change estimating means carry out correction during respective estimating operation in accordance with the estimated SOC of the battery.

9. Means for estimating a state of charge of a battery according to claim 3, wherein the pseudo-SOC estimating means, the electromotive force estimating means, and the dynamic voltage change estimating means carry out correction during respective estimating operation in accordance with the estimated SOC of the battery.

10. Means for estimating a state of charge of a battery according to claim 2, wherein the dynamic voltage change estimating means is formed by a neural network having a feedback path.

11. Means for estimating a state of charge of a battery according to claim 3, wherein the dynamic voltage change estimating means is formed by a neural network having a feedback path.

12. Means for estimating a state of charge of a battery according to claim 4, wherein the dynamic voltage change estimating means is formed by a neural network having a feedback path.

* * * * *